US006900636B2

(12) United States Patent
Leussler

(10) Patent No.: US 6,900,636 B2
(45) Date of Patent: May 31, 2005

(54) TRANSMISSION AND RECEIVING COIL FOR MR APPARATUS

(75) Inventor: Christoph Guenther Leussler, Hamburg (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 12 days.

(21) Appl. No.: 10/478,195

(22) PCT Filed: May 17, 2002

(86) PCT No.: PCT/IB02/01726
§ 371 (c)(1),
(2), (4) Date: Nov. 19, 2003

(87) PCT Pub. No.: WO02/095435
PCT Pub. Date: Nov. 28, 2002

(65) Prior Publication Data
US 2004/0155656 A1 Aug. 12, 2004

(30) Foreign Application Priority Data
May 19, 2001 (DE) .......................... 101 24 465

(51) Int. Cl.[7] ................................ G01V 3/00
(52) U.S. Cl. ........................ 324/318; 324/322
(58) Field of Search ................. 324/318, 322, 324/300, 307, 309; 600/421, 422

(56) References Cited
U.S. PATENT DOCUMENTS

| 5,144,241 | A | | 9/1992 | Oppelt et al. |
| 5,179,332 | A | | 1/1993 | Kang |
| 5,646,531 | A | | 7/1997 | Renz |
| 6,043,658 | A | * | 3/2000 | Leussler ............... 324/318 |
| 6,650,118 | B2 | * | 11/2003 | Leussler ............... 324/318 |

FOREIGN PATENT DOCUMENTS

| DE | 43 31 021 A1 | 3/1995 |
| EP | 0 366 188 | 2/1990 |
| EP | 0 390 476 | 3/1990 |

OTHER PUBLICATIONS

C. Leussler, et al.; The Bandpass Birdcage Resonator Modified as a Coil Array for Simultaneous MR Acquisition; Proceedings of the ISMRM, No. 176, Vancouver, 1997.

Duerr, W., et al.; A Dual–Frequency Circularly Polatizing Whole–Body MR Antenna for 69/170 MHZ; MR in Medicine, Academic Press, vol. 19, pp. 446–455.

* cited by examiner

*Primary Examiner*—Louis Arana
(74) *Attorney, Agent, or Firm*—Thomas M. Lundin

(57) ABSTRACT

The invention relates to an arrangement for generating RF fields in the examination volume (100) of an MR apparatus. A plurality of resonator segments are arranged around the examination volume (100) within the gradient tube (103), said resonator segments being connected together so as to form a body coil. Each resonator segment is provided with a conductor element (104) which is constructed as a planar strip and extends parallel to the longitudinal axis of the main field magnet. The resonator segments are electromagnetically decoupled from one another by means of intermediate capacitances, so that a separate transmission channel (1 to 8) can be associated with each resonator segment, the RF feeding into the relevant resonator segment taking place via said channel. Because the phase and the amplitude of the RF feeding can be individually selected for each resonator segment, the arrangement in accordance with the invention enables substantially complete control of the RF field distribution in the examination volume (RF shimming).

11 Claims, 6 Drawing Sheets

TRANSMISSION AND RECEIVING COIL FOR MR APPARATUS

BACKGROUND

The invention relates to an arrangement for generating RF fields in the examination volume of an MR apparatus, which arrangement includes a body coil which consists of a plurality of resonator segments which are arranged around the examination volume and each of which consists of at least one conductor element which extends parallel to the longitudinal axis of a main field magnet and of at least one capacitor element.

The invention also relates to an MR apparatus which includes an arrangement for generating RF fields in accordance with the invention.

The RF system of a conventional MR apparatus includes a transmission and receiving coil such as, for example, an integrated body coil which can be used for the volume imaging of the examination volume. In order to achieve an enhanced receiving quality (enhanced signal-to-noise ratio, higher resolution), separate surface coils or so-called phased array coils can also be used. The body coils used for the excitation as well as the detection of MR signals are usually so-called birdcage resonators (birdcage coils). These resonators consist of a plurality of conductor rods which are arranged around the examination volume so as to extend parallel to the main field direction, said conductor rods being connected to one another via loop conductors at the extremities of the coil. The resonance behavior of the body coil is determined by capacitor elements which connect the conductor elements in a manner such that they form a network. The first resonance mode (fundamental mode) of these resonators is characterized by a $B_1$ field distribution which is uniform throughout the inner zone of the resonator. The same holds for the spatial sensitivity profile in the detection mode. Therefore, for volume imaging the body coil customarily operates in the fundamental mode during the transmission and the reception. It is also possible to control the resonator in such a manner that orthogonal resonances are excited at the same frequency, that is, decoupled resonances intended for quadrature detection.

In MR imaging the nuclear magnetization is localized within the examination volume by means of temporally variable, spatially inhomogeneous magnetic fields (magnetic field gradients). For imaging the spin resonance signal is recorded in the time domain as a voltage which is induced into the body coil surrounding the examination volume under the influence of a suitable sequence of RF and gradient pulses. The actual image reconstruction then takes place by Fourier transformation of the time signals. The sampling of the reciprocal k space, governing the volume to be imaged (field of view or FOV) as well as the image resolution, are determined by the number, the distance in time, the duration and the strength of the gradient pulses used. Requirements imposed on the image format and the image resolution govern the number of phase encoding steps and hence the duration of the imaging sequence. In contemporary MR apparatus the aim is to realize imaging with an as high as possible resolution in an as short as possible period of time. Special requirements are thus imposed as regards the gradient system of the MR apparatus in order to enable as fast as possible switching of as strong as possible magnetic field gradients.

The gradient system in MR apparatus is customarily accommodated in a so-called gradient tube which surrounds the examination volume. Between the gradient tube and the body coil there is arranged an RF shield which on the one hand keeps interference signals from the surroundings away from the examination volume and on the other hand prevents radiation of RF power to the surroundings of the MR apparatus. The gradient field strength can be increased, for example, by reducing the diameter of the gradient tube. When the examination volume and the inner diameter of the body coil are maintained in such a case, the distance between the RF shield and the body coil will be reduced. It is a drawback that the small distance between the conductor elements of the body coil and the RF shield leads to a reduction of the $B_1$ field strength or the detection sensitivity in the interior of the coil. This has the drawback that the transmission power required is increased and at the same time the signal-to-noise ratio is degraded. The reduction of the tube diameter also has adverse effects on the resonance behavior of the body coil, because the frequency spacing of the individual resonance modes becomes too small, so that undesirable mode coupling occurs. When customary birdcage resonators are used as the transmission and receiving coil, therefore, limits are imposed in respect of increasing the gradient field strength by reducing the tube diameter.

Alternatively, the gradient field strength can be increased by utilizing a gradient tube which has an asymmetrical cross-section. However, this also necessitates the use of asymmetrical body coils. Such asymmetrical resonator arrangements give rise to a series of problems in practice. On the one hand, it is difficult to orthogonalize such a body coil so as to enable quadrature operation. On the other hand, the RF field variation inside the coil is dependent on the current distribution in the array of conductor elements, so that the homogeneity of the RF field in the transmission mode, and hence of the spatial sensitivity profile in the receiving mode, usually is not satisfactory in the case of asymmetrical resonators.

Leussler et al. already proposed a birdcage resonator which operates in a degenerated resonance mode in which the spatially neighboring segments of the resonator are decoupled; that is, they oscillate independently of one another (see Leussler et al., Proceedings of the ISMRM, No. 176, Vancouver 1997). In the known coil the resonance behavior employed is achieved by a suitable choice of the capacitor elements. Unfortunately, only the decoupling of directly neighboring resonator segments can be achieved in this way. The coupling between more remote segments is too high, so that operation of the coil in the resonance transmission mode is not possible.

SUMMARY

Starting from the cited state of the art, the present invention has for its object to provide an improved RF transmission and receiving arrangement for MR apparatus which can be used for arbitrary tube diameters, that is, notably also for small and asymmetrical tube diameters. At the same time an adequate homogeneity and a suitably stable resonance behavior should be ensured.

This object is achieved by means of an arrangement of the kind set forth which is characterized in that the resonator segments are electromagnetically decoupled from one another and that a separate transmission channel is associated with each resonator segment, via which transmission channel RF feeding takes place into the relevant resonator segment, the phase and/or the amplitude of the RF feeding being individually selectable for each resonator segment.

Because a separate transmission channel is associated with each resonator segment, the field distribution in the examination volume can be advantageously controlled completely. This is because any conceivable current distribution can be generated in the arrangement of the conductor elements by selecting the amplitude and the phase on the individual transmission channels. The variation in time of the RF feeding can also be individually selected so as to be different for each transmission channel. It is notably possible to imitate the field distribution of a conventional birdcage resonator provided with the same number of resonator segments in any arbitrary resonance mode. The amplitude and the phase of each individual transmission channel can be controlled by the software of the MR apparatus, thus enabling direct interactive control of the field distribution (RF Shimming). For example, it is feasible to integrate fully automatic control of the RF field homogeneity in the imaging sequence so as to compensate for varying effects on the field distribution which are due, for example, to the different dielectric properties of the patients to be examined.

For the arrangement for generating RF fields in accordance with the invention it is merely necessary that the individual resonator segments are electromagnetically decoupled from one another. Thus, the body coil must exhibit a resonance behavior for which it is ensured that the individual resonator segments resonate independently of one another at the desired resonance frequency. As has already been stated, coil arrangements are known in which at least directly neighboring resonator segments are decoupled from one another. The arrangement in accordance with the invention must be provided with additional means whereby the electromagnetic couplings are minimized also between resonator segments which are more remote in space. It has been found in practice that a mutual isolation of the resonator segments of approximately 20 dB is desirable so as to preclude crosstalk between the individual transmission channels as much as possible.

The mutual electromagnetic decoupling of the resonator segments can be particularly simply realized by means of capacitances or inductances arranged between the conductor segments. By a suitable choice of the capacitance or inductance values it must be ensured that no resonant coupling exists between the various resonator segments. It may then be useful to provide decoupling networks (consisting of capacitances and inductances) between the conductor segments of both neighboring resonator segments and more remote resonator segments.

A particularly advantageous embodiment of the arrangement in accordance with the invention is obtained when the conductor segments are constructed essentially as rectangular, planar strips. It has been found that when flat conductor strips are used, the magnetic couplings between more remote resonator segments are attenuated. Moreover, a particularly space-saving embodiment of the body coil can be realized when use is made of the planar conductor strips. Furthermore, the current distribution within the strip-like conductor elements can be readily influenced, for example, by providing holes or recesses or by suitably structuring the edges of the conductor strips. The use of planar conductor strips also leads to a planar current distribution within the conductor elements, so that an enhanced local field homogeneity is achieved.

The RF shield present between the gradient tube and the body coil attenuates the field strength in the examination volume, so that normally an as large as possible distance must be maintained between the coil system and the RF shield. However, in the arrangement in accordance with the invention it is advantageous to arrange the conductor elements of the individual resonator segments at a small distance from the RF shield. This is because the proximity to the RF shield reduces the mutual magnetic coupling between the individual conductor segments; this is an advantage for the resonance behavior of the body coil in the sense of the invention. It may be advantageous to choose the distance between the conductor elements and the RF shield to be such that on the one hand adequate magnetic decoupling between the conductor elements is achieved and that the RF field strength in the examination volume is not excessively reduced on the other hand. Experiments have demonstrated that it is advantageous to maintain a distance of from 0.5 to 2 cm, but preferably from 0.7 to 1.5 cm, between a resonator segment and the RF shield.

Because of the possibility of selection of an arbitrary spatial distribution of the RF field in the examination volume by means of the arrangement in accordance with the invention, a series of further fields of applications become feasible. For example, gradients can be generated in different spatial directions in the RF field. Because of the selection of spatially and temporally variable RF field patterns, a spatial code can be impressed on the excited nuclear magnetization distribution; this code can be used for fast volume imaging (Transmit SENSE method). A spatially selective pre-saturation of the nuclear magnetization in the examination volume is also feasible.

A particularly advantageous embodiment is obtained in conformity with claim 7 when the body coil in the arrangement in accordance with the invention is subdivided into at least two independent, axially successively arranged segments. In this case it is possible to preselect the RF field distribution so as to be variable also in the main field direction (z direction), thus enabling notably RF field gradients along the z axis.

It is also advantageous to provide each resonator segment with a separate receiving channel via which the MR signals detected by means of the relevant resonator segments are transferred to a receiving unit for further processing. On the one hand volume imaging can then be carried out with a spatially homogeneous sensitivity profile by combination of the MR signals detected by means of the individual resonator segments. Alternatively, sub-images can be formed from the separately detected MR signals, which sub-images are combined at a later stage so as to form an overall image. This may be advantageous on the one hand for improving the signal-to-noise ratio, the individual resonator segments then being used as synergy coils. It is also possible to combine the individual images on the basis of the spatial sensitivity profiles assigned to the individual resonator segments, thus saving measuring time during imaging (SENSE method).

The arrangement in accordance with the invention advantageously allows the examination volume to have an asymmetrical cross-section in the plane extending perpendicularly to the main field direction, the conductor elements of the individual resonator segments being arranged at the periphery of said cross-section. Because the RF field distribution in the examination volume can be controlled practically arbitrarily, during the detection adequate homogeneity of the excitation field as well as of the spatial sensitivity profile can be ensured also in the case of such an asymmetrical geometry of the body coil. As stated before, asymmetrical examination volumes offer the advantage that particularly high magnetic field gradients can be realized.

The arrangement for generating RF fields can be used in an MR apparatus. A particularly simple implementation is obtained in which each transmission channel is connected to an output of a connection network (combiner hybrid) which is associated with the relevant resonator segment; this network distributes the power of a transmission amplifier among the individual resonator segments. The connection network for each resonator segment then defines the phase and the amplitude of the respective RF signal fed in. This embodiment offers the advantage that only a single power transmitter is required for the RF feeding, the output signal of said power transmitter being distributed among the individual resonator segments by means of the combiner hybrid. The distribution is preferably performed in such a manner that an as homogeneous as possible RF field distribution is realized in the examination volume. It is advantageous when a measuring element (pick-up coil) is associated with at least one resonator segment, but preferably with each resonator segment; the RF field strength radiated by the respective resonator segment is then measured by said measuring element and the measuring signal is applied to the control unit of the MR apparatus in order to monitor and/or control the phase and the amplitude of the RF signal fed in.

DRAWINGS

Embodiments of the invention will be described in detail hereinafter with reference to the Figures. Therein:

DESCRIPTION

Figure 1:
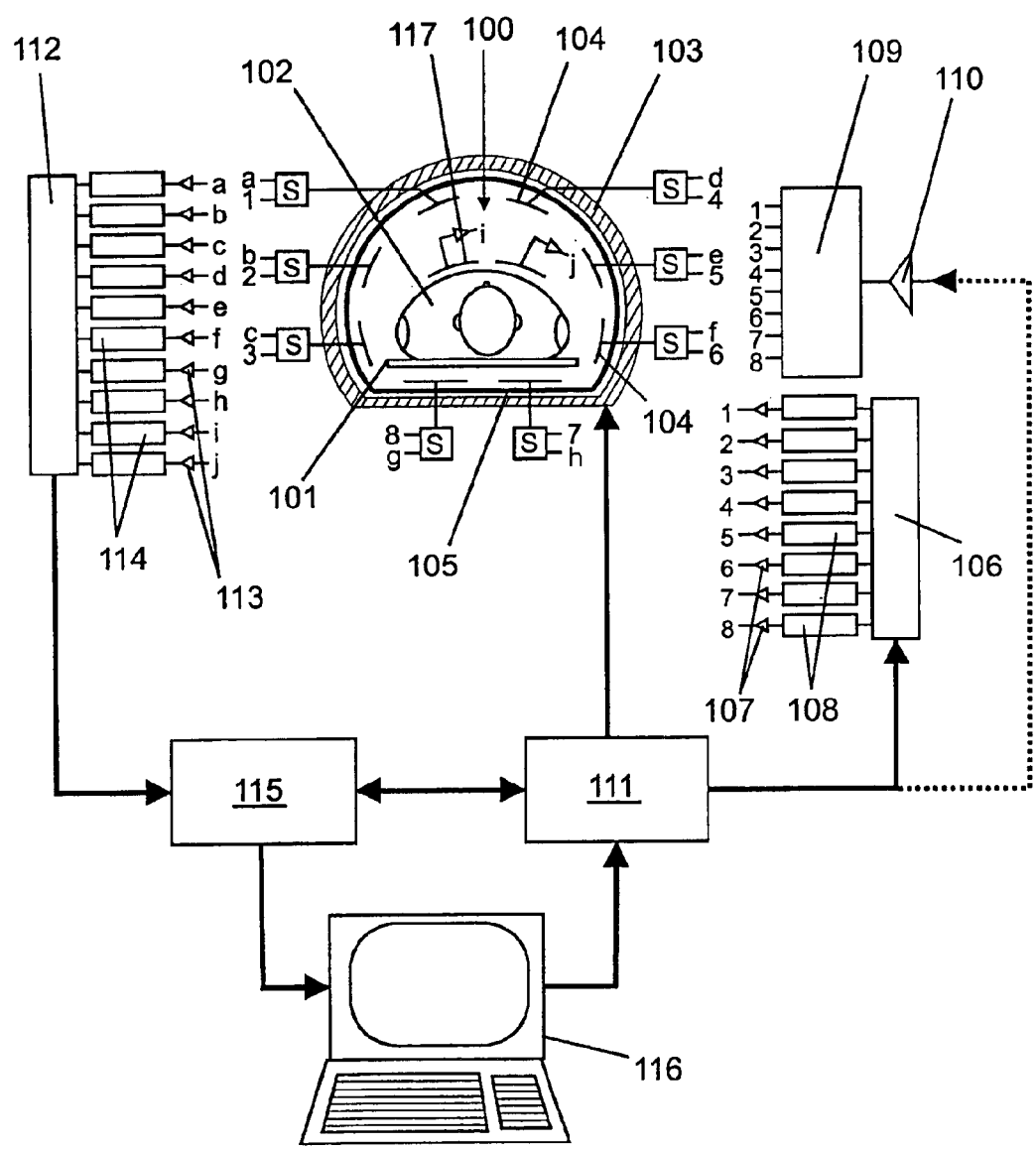
FIG. 1 shows an MR apparatus provided with a transmission and receiving arrangement in accordance with the invention.

At the center of the MR apparatus shown in FIG. 1 there is situated an examination volume 100 in which a patient 102 is arranged on a patient table 101. A static magnetic field of a strength of, for example, 1.5 Tesla is generated at the area of the examination volume 100 by means of a main field magnet (not shown). Moreover, for MR imaging temporally variable magnetic field gradients must be generated in the examination volume 100. To this end, there are provided a plurality of gradient coils which are accommodated in a gradient tube 103 which surrounds the examination volume 100. The gradient tube 103 has an asymmetrical cross-section; this is necessary so as to achieve as high as possible gradient field strengths as described above. The generating of RF fields, also being necessary for MR imaging, is realized by means of resonator segments which are arranged in the gradient tube 103 around the examination volume 100 and consist of planar, strip-shaped conductor elements 104 which extend parallel to the longitudinal axis of the main field magnet. The conductor elements 104 are connected, via capacitor elements, to one another in a network, and possibly also to ground, thus governing the resonance behavior of the arrangement. The capacitor elements constitute, in conjunction with the conductor elements 104, the body coil of the MR apparatus which is used not only for exciting spin resonance signals in the examination volume 100 but also for the detection thereof. Between the gradient tube 103 and the conductor elements 104 of the body coil there is arranged an RF shield 105 which encloses the entire examination volume 100. This shield keeps interference signals from the environment of the MR apparatus away and also suppresses the output of RF radiation to the environment. Each of the eight conductor elements 104 shown in FIG. 1 is connected to a switch S via which the relevant conductor element 104 is connected to one of two possible terminals, that is, in dependence on the mode of operation. The terminals which are intended for the transmission mode are denoted by the reference numerals 1 to 8 and those intended for the receiving mode are denoted by the letters a to h. The terminals 1 to 8 are associated with the correspondingly numbered outputs of a transmission unit 106. For each resonator segment of the body coil this unit has a respective transmission channel which includes a respective power amplifier 107 as well as an RF control unit 108. The amplitude and the phase of the RF signal can be individually adjusted for each individual transmission channel by means of the RF control unit 108, so that practically any desired RF field distribution can be produced in the examination volume 100 of the MR apparatus. As a less intricate alternative it is also possible to utilize a distribution network 109 (combiner hybrid) whereby the output signal of an RF transmission amplifier 110 is distributed among the terminals 1 to 8, so that the combiner hybrid defines the amplitude and phase of the RF signal for each output channel 1 to 8. In order to generate RF pulses in the examination zone 100, the transmission unit 106, or the transmission amplifier 110, is connected to a control unit 111. For the control of the temporal succession of the gradient pulses, moreover, the control unit 111 is connected to the gradient tube 103. The terminals a to h, intended for the receiving mode, are associated with the receiving channels of a receiving unit 112 which are denoted by corresponding letters. Each receiving channel is provided with a sensitive RF preamplifier 113 as well as with a demodulator 114. The MR signals detected by the receiving unit 112 are applied to a reconstruction unit 115 in which the digitized signals are combined and subjected to Fourier analysis. The images generated by means of the reconstruction unit 115 are then output via the monitor of a microcomputer 116. The microcomputer 116 at the same time serves for the control of the MR apparatus by a user; the computer 116 is also connected to the control unit 111 for this purpose. Moreover, surface coils 117 which are arranged directly on the body of the patient 102 may also be used for the imaging, said surface coils being connected, via the terminals i and j, to the corresponding inputs of the receiving unit 112. The surface coils 117 can be used, for example, for local cardiac imaging where the conductor elements 104 of the body coil (terminals g and h), arranged on the back of the patient 102, are used for the data acquisition, in conjunction with the surface coils 117, in the synergy mode.

Figure 2:
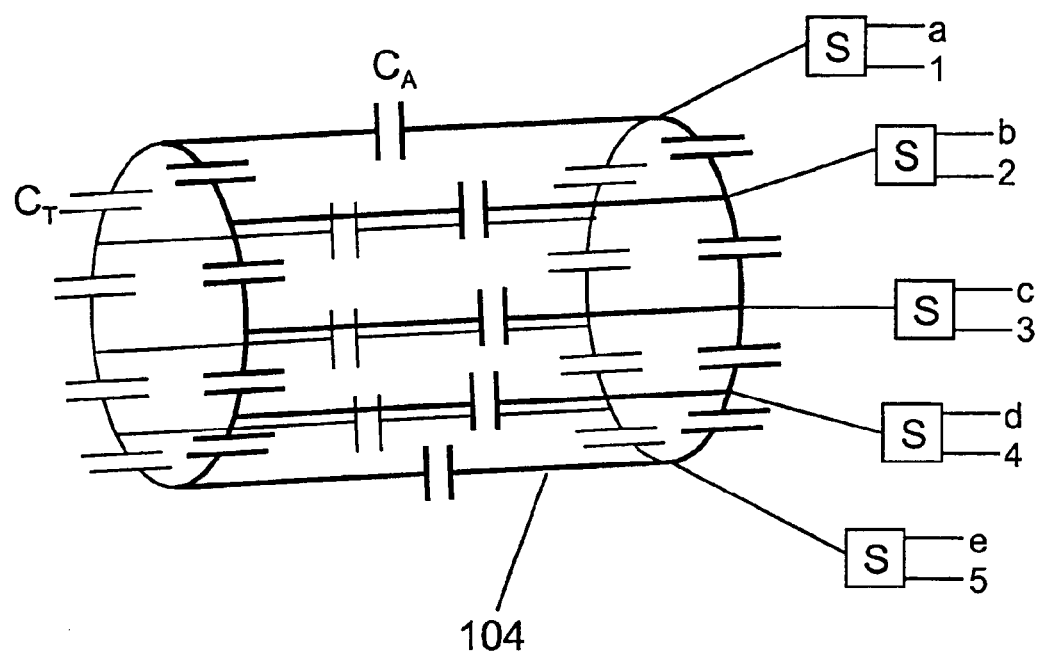
FIG. 2 shows the use of a decoupled birdcage resonator in accordance with the invention.

FIG. 2 shows a conventional birdcage resonator in which the loop capacitances $C_T$ and the rod capacitances $C_A$ are chosen to be such that the resonator operates in a decoupled mode at the desired resonance frequency (see Leussler et al., Proceedings of the ISMRM, No. 176, Vancouver 1997). A resonator of this kind can be used with an arbitrary diameter and an arbitrary cross-section (symmetrical or asymmetrical) in accordance with the invention. Because of the special resonance mode of the resonator, as already mentioned, the directly neighboring resonator segments are adequately decoupled from one another. For the resonant transmission mode, however, the couplings between more remote segments are too high. In order to achieve adequate decoupling (at least −20 dB), the individual conductor rods 104 can be insulated from one another by means of suitable impedance networks. In given circumstances such decoupling from each time the next neighbor but one suffices. For the decoupling it is also necessary to select a comparatively small distance between the resonator and the RF shield, that is, even when the RF field strength in the examination volume is thus slightly reduced. The rods 104 which extend parallel to the main field direction may also be constructed as planar conductor strips in the resonator which is only diagrammatically represented in FIG. 2. In this construction of the resonator, that is, with capacitances in the rods or strips, no current is dissipated via the RF shield because of the electrical isolation. Furthermore, it may be advantageous to construct the resonator in such a manner that the distance between the RF shield and the conductor strips 104 varies in the longitudinal direction thereof, the distance from the RF shield being larger at the end faces of the resonator than in the central region. The homogeneity of the RF field in the examination volume is thus enhanced.

Figure 3:
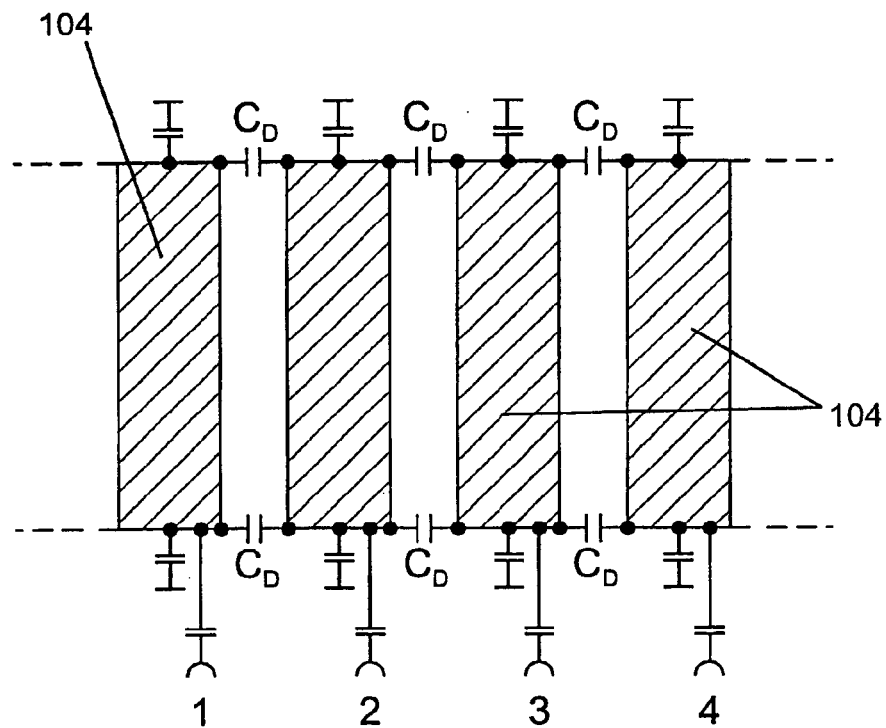
FIG. 3 is a plane representation of a body coil in accordance with the invention.
Figure 4:
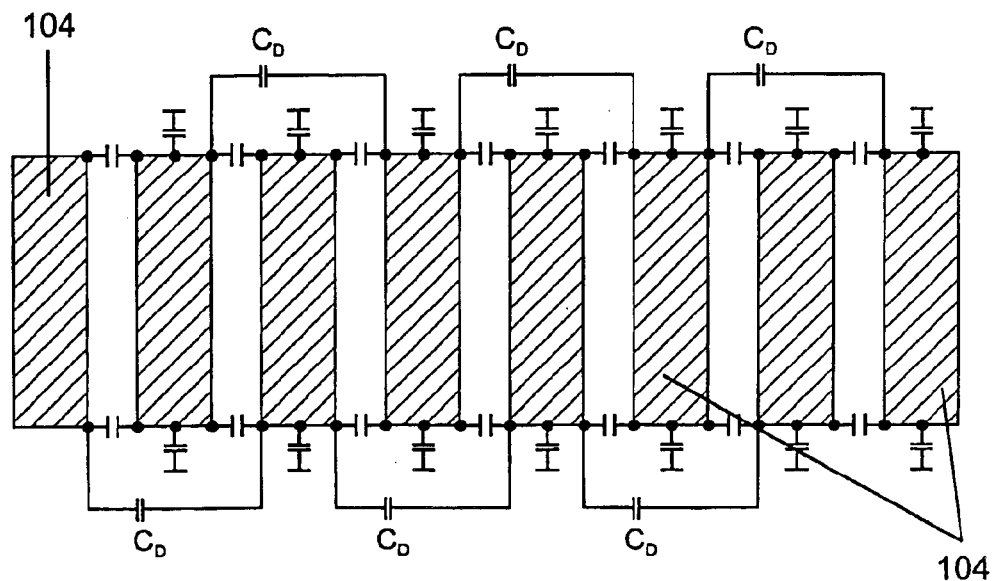
FIG. 4 shows an alternative embodiment of a body coil in accordance with the invention.
Figure 5:
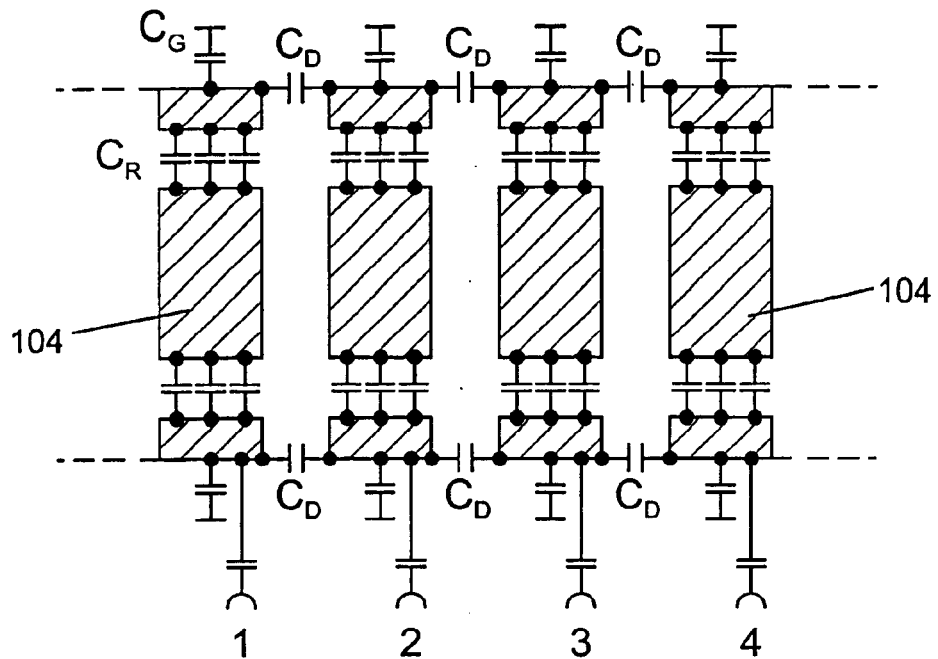
FIG. 5 shows a further embodiment of a body coil in accordance with the invention.

The FIGS. 3, 4 and 5 are plane representations of body coils in accordance with the invention. The coils consist of a plurality of planar conductor strips 104 which are arranged around the examination volume. The resonance frequency of the individual resonator segments is determined by the capacitors which are connected to ground in the FIGS. 3 and 4. In the body coil which is shown in FIG. 5 the resonance frequency is determined by the capacitances $C_R$ which are provided in the conductor strips and the capacitances $C_G$ which are connected to ground. An arrangement of this kind is particularly advantageous so as to avoid electromagnetic propagation effects at high resonance frequencies. Inside the conductor strips a plurality of parallel-connected capacitances $C_R$ is used so as to divide the high current strengths in the transmission mode and to achieve a uniform current distribution which is advantageous for the homogeneity of the RF field. The capacitances $C_R$ can also be realized by providing overlaps between the ends of the conductor strips 104 which abut at the area of the capacitances $C_R$; a dielectric material with an as high as possible dielectric constant (for example, ceramic) is then provided in the zone of overlap between the strips. The capacitance between the conductor strips 104 and the RF shield can also be realized in the same way. The capacitances $C_D$ provided between the individual conductor elements 104 serve for mutual decoupling. Such decoupling is a prerequisite in enabling the individual resonator segments in accordance with the invention to be controlled independently of one another via separate transmission channels. To this end, each individual conductor element 104 is connected, via an intermediate capacitor, to a transmission channel 1, 2, 3 or 4 (FIGS. 3, 5). In the arrangements shown in the FIGS. 3 and 5 decoupling capacitances are provided between directly neighboring conductor strips 104. Adequate decoupling of more remote resonator segments must be ensured by taking other steps (geometry of the conductor elements, distance in space, proximity to the RF shield). In the body coil which is shown in FIG. 4 the next neighbors but one are also decoupled from one another by intermediate capacitances $C_D$. The connection between the more remote conductor elements preferably is realized via coaxial cables of suitable length ($\lambda/2$). Inductances (coils) can also be used for the decoupling instead of capacitances.

Figure 6:
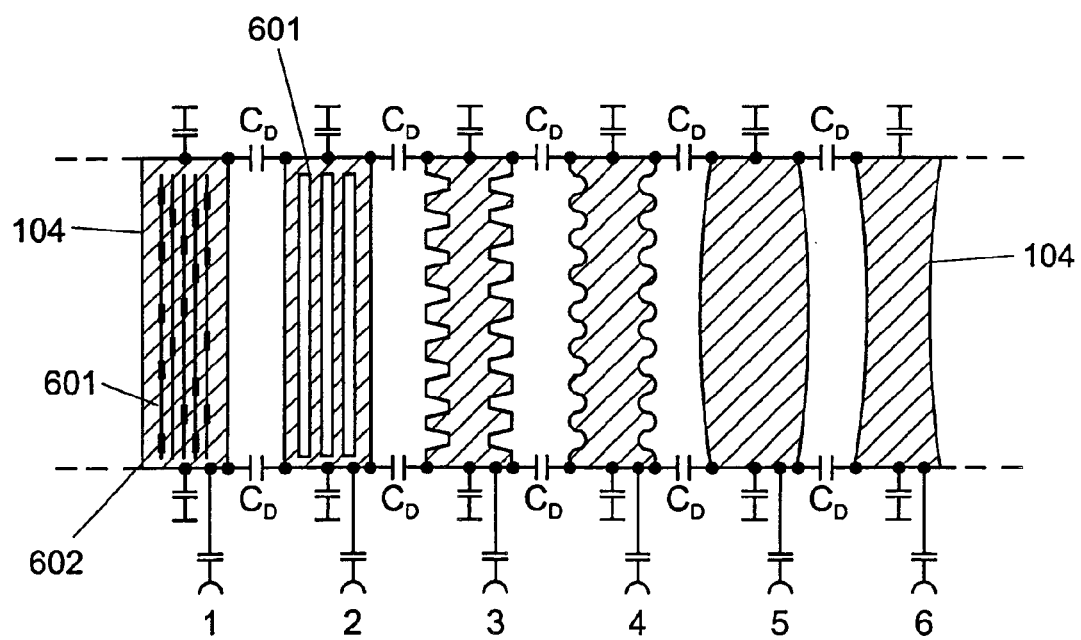
FIG. 6 shows differently structured strip-shaped conductor elements.

FIG. 6 shows various embodiments of conductor strips 104 which are provided with different structures so as to achieve an homogeneous as possible current distribution. To this end it is particularly advantageous to increase the edge impedance of the conductor strips by way of one of the types of sawtooth-like edge structuring shown. Convex or concave geometries are also feasible for the conductor strips 104; it is also possible to provide slits 601 which can be bridged by capacitors 602.

Figure 7:
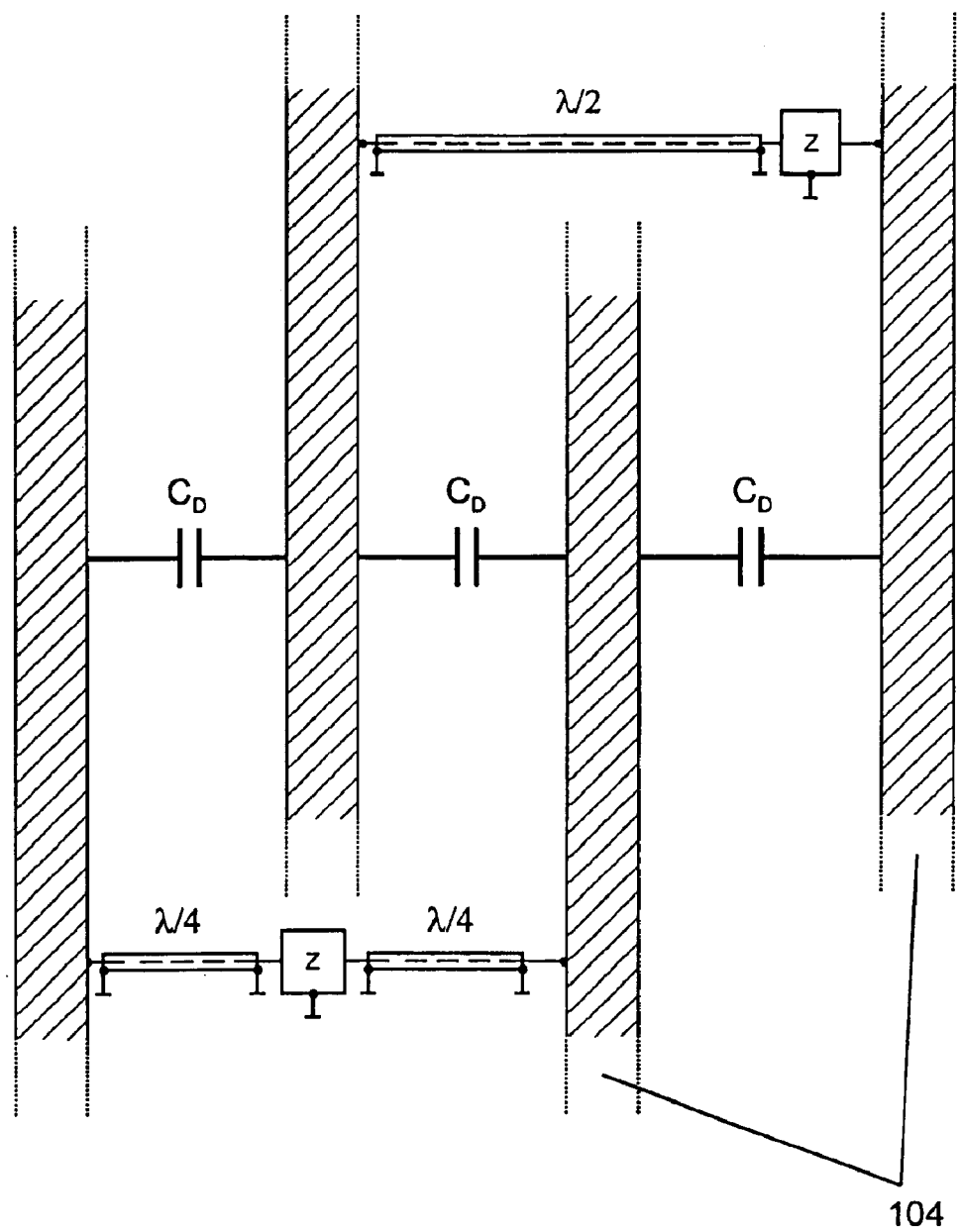
FIG. 7 shows the decoupling of conductor elements.

FIG. 7 shows the realization of the mutual electromagnetic decoupling of next-but-one resonator segments 104. Because the corresponding conductor strips 104 are not situated directly adjacent one another, they are connected by means of coaxial cables of suitable length ($\lambda/2$ or $\lambda/4$). A suitable impedance network Z then provides the desired isolation. The object is to supply the respective other resonator segment with the signal via the impedance network Z in such a manner that compensation of the directly coupled-in RF signal is achieved by way of suitable selection of the amplitude and the corresponding shift of the phase. Such coupling-in, of course, can also be used to the same extent for directly neighboring segments of the resonator and also for remote segments thereof. In the simplest case the impedance network Z may consist of a capacitor via which the relevant resonator segments are connected or also of an inductance which is connected to ground.

Figure 8:
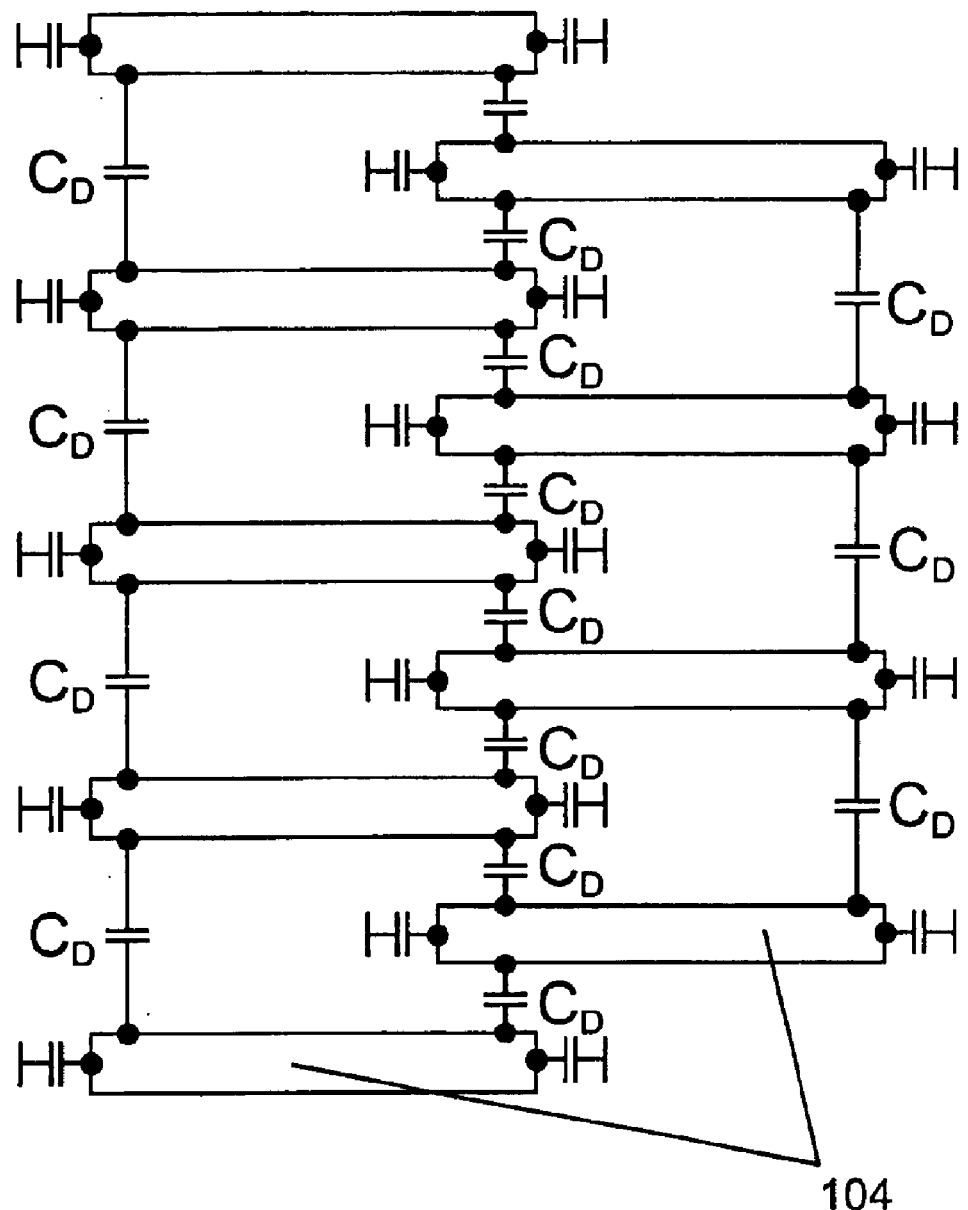
FIG. 8 is a plane representation of a body coil subdivided into two independent, successively arranged segments.

FIG. 8 shows an interleaved arrangement of successive conductor elements which are decoupled from one another in accordance with the invention by intermediate capacitances $C_D$ and are connected together so as to form a body coil. Two independent, axially successive segments of the body coil are thus available; they can be used for controlling the RF field distribution in the direction parallel to the longitudinal axis of the main field magnet (z direction).

What is claimed is:

1. An arrangement for generating RF fields in the examination volume of an MR apparatus, which arrangement includes a body coil which comprises a plurality of resonator segments which are arranged around the examination volume and each of which comprises at least one conductor element which extends parallel to the longitudinal axis of a main field magnet and of at least one capacitor element, wherein the resonator segments are electromagnetically decoupled from one another and that a separate transmission channel is associated with each resonator segment, via which transmission channel RF feeding takes place into the relevant resonator segment, the phase and/or the amplitude of the RF feeding being individually selectable for each resonator segment wherein the electromagnetic decoupling of the resonator segments is realized by means of capacitances or inductances which are connected between the conductor elements.

2. An arrangement as claimed in claim 1, wherein there is provided an RF shield which extends around the body coil, the conductor elements of the individual resonator segments being arranged at a small distance of from 0.5 to 2 cm from the RF shield.

3. An arrangement as claimed in claim 1, wherein the body coil is subdivided into at least two independent, axially successively arranged segments.

4. An arrangement for generating RF fields in the examination volume of an MR apparatus, which arrangement includes a body coil which comprises a plurality of resonator segments which are arranged around the examination volume and each of which comprises at least one conductor element which extends parallel to the longitudinal axis of a main field magnet and of at least one capacitor element, wherein the resonator segments are electromagnetically decoupled from one another and that a separate transmission channel is associated with each resonator segment, via which transmission channel RF feeding takes place into the relevant resonator segment, the phase and/or the amplitude of the RF feeding being individually selectable for each resonator segment, wherein the conductor elements are constructed essentially as rectangular, planar strips.

5. An arrangement as claimed in claim 4, wherein the edges of the conductor strips are provided with a sawtooth-like structure.

6. An arrangement as claimed in claim 4, wherein the surfaces of the conductor strips are provided with slits which extend parallel to the longitudinal direction thereof.

7. An arrangement for generating RF fields in the examination volume of an MR apparatus, which arrangement includes a body coil which comprises a plurality of resonator segments which are arranged around the examination volume and each of which comprises at least one conductor element which extends parallel to the longitudinal axis of a main field magnet and of at least one capacitor element, wherein the resonator segments are electromagnetically decoupled from one another and that a separate transmission channel is associated with each resonator segment, via which transmission channel RF feeding takes place into the relevant resonator segment, the phase and/or the amplitude of the RF feeding being individually selectable for each resonator segment, wherein with each resonator segment there is associated a separate receiving channel via which the MR signals detected by means of the relevant resonator detector segment are applied to a receiving unit for further processing.

8. An arrangement for generating RF fields in the examination volume of an MR apparatus, which arrangement includes a body coil which comprises a plurality of resonator segments which are arranged around the examination volume and each of which comprises at least one conductor element which extends parallel to the longitudinal axis of a main field magnet and of at least one capacitor element, wherein the resonator segments are electromagnetically decoupled from one another and that a separate transmission channel is associated with each resonator segment, via which transmission channel RF feeding takes place into the relevant resonator segment, the phase and/or the amplitude of the RF feeding being individually selectable for each resonator segment, wherein the examination volume has an asymmetrical cross-section in the plane extending perpendicularly to the main field direction, the conductor elements of the individual resonator segments being arranged at the periphery of said cross-section.

9. An MR apparatus which includes:

at least one main field coil for generating a uniform, steady magnetic field in an examination volume;

a number of gradient coils for generating gradient pulses in different spatial directions;

a body coil which comprises a plurality of resonator segments which are arranged around the examination volume and each of which comprises at least one conductor element which extends parallel to the longitudinal axis of the main field coil and of at least one capacitor element, at least one control unit for controlling the succession in time of the RF and gradient pulses, and a reconstruction unit and a visualization unit, wherein the resonator segments of the body coil are electromagnetically decoupled from one another, that a separate transmission channel is associated with each resonator segment, via which transmission channel the RF feeding takes place into the relevant resonator segment, the phase and/or the amplitude of the RF feeding being individually selectable for each resonator segment, and that a separate receiving channel is associated with each resonator segment, via which receiving channel the MR signals detected by means of the relevant resonator segment are applied to a receiving unit for further processing by means of the reconstruction unit and the visualization unit.

10. An MR apparatus as claimed in claim 9, wherein each transmission channel is connected to an output of a connection network which is associated with the relevant resonator segment and via which the power of a transmission amplifier is distributed between the individual resonator segments, the phase and the amplitude of the respective RF signal fed in for each resonator segment being defined by the connection network.

11. An MR apparatus as claimed in claim 9, wherein with at least one resonator segment there is associated a measuring element via which the RF field strength emitted by the relevant resonator segment is determined, the measuring signal being applied to the control unit in order to monitor and/or control the phase and the amplitude of the RF signal fed in.

* * * * *